United States Patent [19]

Cox

[11] Patent Number: 4,922,182
[45] Date of Patent: May 1, 1990

[54] AUTO REACTANCE COMPENSATED NON-CONTACTING RESISTIVITY MEASURING DEVICE

[75] Inventor: Mason F. Cox, Medina, N.Y.

[73] Assignee: Monroe Electronics, Inc., Lyndonville, N.Y.

[21] Appl. No.: 228,176

[22] Filed: Aug. 3, 1988

[51] Int. Cl.⁵ .............................................. G01R 27/26
[52] U.S. Cl. .................................... 324/682; 324/691; 324/714
[58] Field of Search .............. 324/64, 62, 61 QS, 57 Q

[56] References Cited

U.S. PATENT DOCUMENTS

| | | | |
|---|---|---|---|
| 3,624,496 | 11/1971 | Feinstein et al. | 324/64 |
| 3,671,857 | 6/1972 | Bergmanis et al. | 324/61 QS |
| 3,974,443 | 8/1976 | Thomas | 324/64 |
| 3,995,213 | 11/1976 | Robinson et al. | 324/64 |
| 4,075,557 | 2/1978 | Jurca | 324/57 Q |
| 4,100,486 | 7/1978 | Casowitz et al. | 324/64 |
| 4,176,313 | 11/1979 | Wrinn | 324/64 |
| 4,353,027 | 10/1982 | Ballato et al. | 324/62 |
| 4,446,424 | 5/1984 | Chatanier et al. | 324/62 |
| 4,797,614 | 1/1989 | Nelson | 324/62 |

OTHER PUBLICATIONS

Abstract, "Sheet Resistance Measurement of Buried Shielding Layers", B. A. Unger et al., EOS/ESD Symposium Proceedings, 1986, pp. 59–61.

Primary Examiner—Reinhard J. Eisenopf
Assistant Examiner—Maura K. Regan
Attorney, Agent, or Firm—Finnegan, Henderson, Farabow, Garrett & Dunner

[57] ABSTRACT

A device for measuring the resistivity of a conductive layer buried beneath an outer layer. The device is capacitively coupled to the buried layer by a driven electrode and a pickup electrode. An adjustable frequency source resonates the two electrodes with an inductor so that an attached meter measures the resistivity of only the buried layer.

11 Claims, 2 Drawing Sheets

AUTO REACTANCE COMPENSATED NON-CONTACTING RESISTIVITY MEASURING DEVICE

BACKGROUND OF THE INVENTION

The present invention relates to a device for measuring resistivity, and specifically to a device for non-invasively and non-destructively measuring the resistivity of a buried conductive layer.

Wrap assemblies used for shipping and storing electronic parts frequently contain a buried conductive layer to protect the electronic parts from electrostatic discharge. The buried layer, which is usually protected by an anti-static outer layer, acts as a Faraday cage to conduct harmful current around instead of through the wrap assembly. The lower the resistivity of the buried layer, i.e., the higher the conductivity, the more effective the buried layer is as a protection medium. It is therefore desirable to be able to test the resistivity of the buried layer.

While it is relatively simple to measure the resistivity of an exposed layer, measurement becomes more difficult when the layer is not directly exposed. Several existing measuring devices, which measure the resistivity of a buried layer by stripping away or puncturing the outer layer, are undesirable because they damage the outer layer. Because the outer layer serves a protective function, resistivity measurements should take place without damaging this layer.

Other existing measurement devices determine the resistivity of the buried layer by capacitively coupling to the buried layer with electrodes. However, these existing measuring devices must compensate for the impedance of the coupling capacitors. Such calculations involve complicated methods calling for expensive and computationally intense rf bridge techniques, which increase the cost of the measuring devices.

SUMMARY OF THE INVENTION

The present invention overcomes the problems and disadvantages of the prior art by capacitively coupling pickup and driven electrodes to the buried layer and generating a frequency which resonates the capacitively coupled pickup and driven electrodes with an inductor, so that only the resistivity of the buried layer is measured.

An object of the invention is to non-invasively measure the resistance of a buried layer without having the reading affected by the measuring instrument.

Additional objects and advantages of the invention will be set forth in the description which follows and, in part, will be obvious from the description, or may be learned by practice of the invention. The objects and advantages of the invention will be realized and attained by means of the elements and combinations particularly pointed out in the appended claims.

More specifically, to achieve the objects and in accordance with the purpose of the invention, as embodied and broadly described herein, the invention is an apparatus for non-invasively, non-destructively measuring a resistivity of a buried conductive layer surrounded by an outer layer, the apparatus comprising a circuit including, a first capacitor including a driven electrode and operative when positioned adjacent the buried layer, a second capacitor including a pickup electrode and operative when positioned adjacent the buried layer, and inductor means connected to the first capacitor. The invention also comprises frequency adjustment means connected to the first and second capacitors and the inductor means for generating a signal having a frequency causing the circuit to resonate, measuring means for measuring a voltage output from the circuit, and means for calculating the resistivity of the buried layer when the circuit is resonating, responsive to the measured voltage of the measuring means.

BRIEF DESCRIPTION OF THE DRAWINGS

The accompanying drawings, which are incorporated in and constitute a part of this specification, illustrate one embodiment of the invention and, together with the description, serve to explain the principles of the invention.

DESCRIPTION OF A PREFERRED EMBODIMENT

Reference will now be made in detail to the present preferred embodiment of the invention, an example of which is illustrated in the accompanying drawings. Whenever possible, the same reference numbers will be used throughout to refer to the same or like parts.

Figure 1:
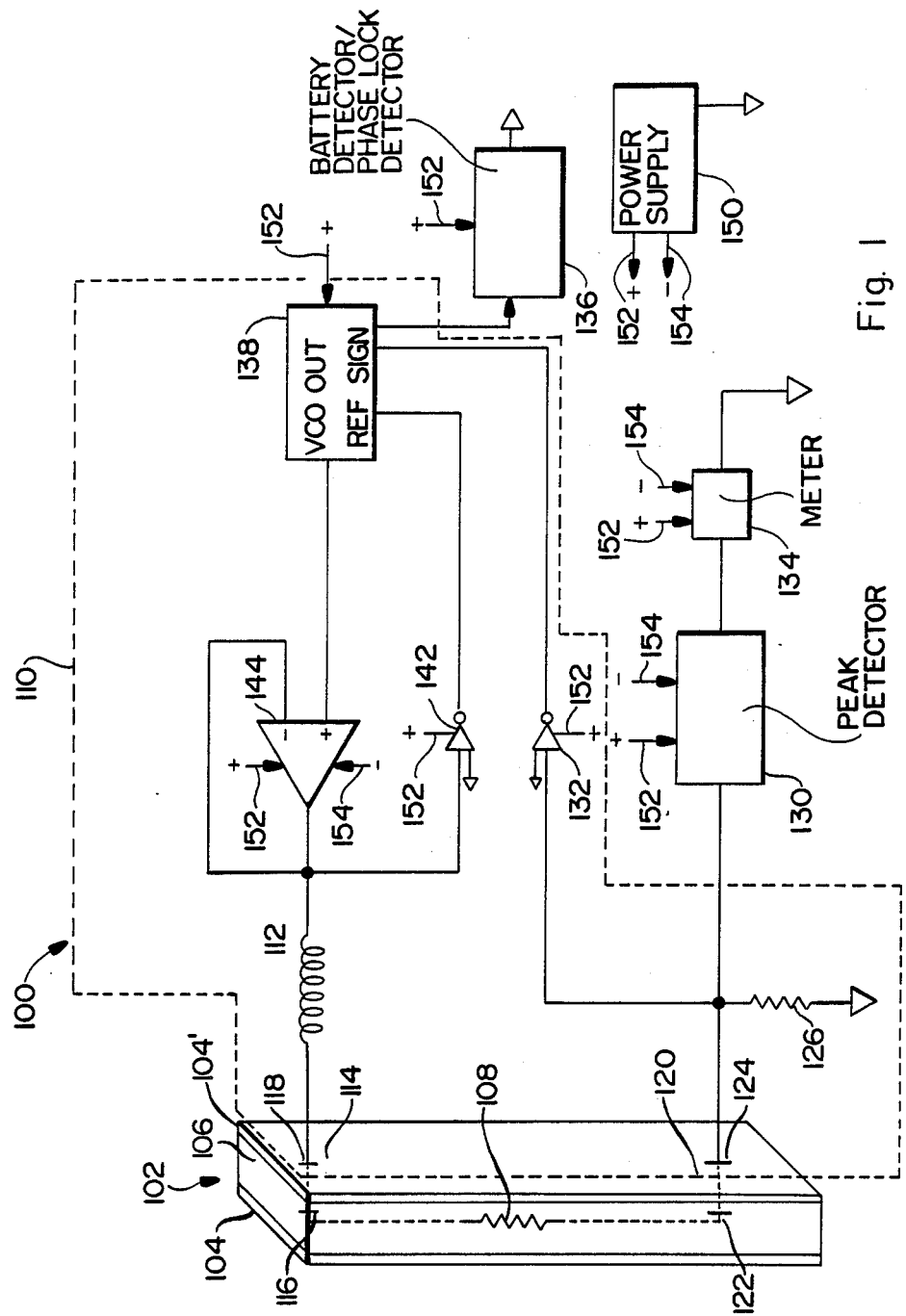
FIG. 1 is a block diagram of a preferred embodiment of the present invention.

FIG. 1 is a block diagram of a device 100 according to a preferred embodiment of the present invention. Device 100 is capacitively coupled to a material under test 102 (not shown to scale), having two outer layers 104 and 104' and a conductive buried layer 106. Material under test 102 has an effective resistance R shown as 108. Device 100 includes a phase-locked loop 110, a peak detector circuit 130, a resistance meter 134, a battery detector/phase-lock detector circuit (battery/PLL detector) 136, and a power supply 150.

Phase-locked loop 110 includes a phase-locked loop/voltage controlled oscillator integrated circuit (PLL/VCO chip) 138, a signal conditioning buffer 142, an operational amplifier 144, an inductor 112, a driven electrode 118, a pickup electrode 124, a sense resistor 126, and a signal conditioning buffer 132. Power supply 150 outputs positive voltage line 152 and negative voltage line 154. Positive voltage line 152 is input to operational amplifier 144, signal conditioning buffer 142, PLL/VCO chip 138, battery/PLL detector 136, meter 134, and peak detector circuit 130. Negative voltage line 154 is input to meter 134, operational amplifier 144, and peak detector circuit 130. In the described embodiment, signal conditioning buffers 132 and 142, sense resistor 126, peak detector circuit 130, meter 134, battery/PLL detector 136, and power supply 150 are locally grounded.

Driven electrode 118 is a first capacitive plate, which is capacitively connected to a second capacitive plate 116 integral to buried layer 106 when device 100 is positioned adjacent the buried layer. Together, driven electrode 118 and second capacitive plate 116 form a first capacitor 114. Pickup electrode 124 is a first capacitive plate, which is capacitively connected to a second capacitive plate 122 integral to the buried layer 106 when device 100 is positioned adjacent the buried layer. Together, pickup electrode 124 and second capacitive plate 122 form a second capacitor 120.

Device 100 can be simplified to a RLC circuit consisting of an inductor (inductor 112), a capacitance (capacitors 114 and 120), and a resistor (108) in series. When the inductive reactance and the capacitive reactance of this simplified RLC circuit are equal, the impedance of the circuit is at a minimum and is equal to the resistance, and the circuit is said to resonate. When the current and voltage of the circuit are in phase, the resistance R of buried layer 106 is equal to:

$$R = E/I,$$

where E is voltage and I is current. Thus, the resistance of the buried layer can be found using only simple calculations.

Signal conditioning buffers 132 and 142 function as a zero crossing detector for a square wave signal from operational amplifier 144, and a sine wave signal from reference resistor 126, respectively. The outputs of signal conditioning buffers 132 and 142 are input to, respectively, a REF input and a SIGN input of PLL/VCO chip 138.

PLL/VCO chip 138 also has an output line VCO OUT. The REF input is a voltage reference signal derived from operational amplifier 144. The SIGN input is a current sense signal derived from sense resistor 126. PLL/VCO chip 138 oscillates until the voltage on REF and the current on SIGN are in phase. When such an in-phase relationship occurs, the signal on line VCO OUT has a frequency equal to the resonant frequency of first capacitor 114, second capacitor 120, and inductor 112. When the circuit is in resonance, the signal output from PLL/VCO chip 138 locks its output frequency, i.e., the frequency of the signal output is stable.

Since, at resonance, the capacitive reactance (Xc) is equal to the inductive reactances (Xc) and the phase angle between the current and voltage of the circuit is zero, the resonant frequency f is equal to:

$$f = \frac{1}{2\pi \sqrt{LC}},$$

where f is in hertz, L is in henrys, and C is in farads.

Peak detector circuit 130 and meter 134 detect the voltage from sense resistor 126 and, in a manner well-known to persons skilled in the electrical arts, use Ohm's law to determine the resistivity of buried layer 106. In a preferred embodiment, peak detector 130 has a non-linear output and, thus, meter 134 is marked with a non-linear scale. In other embodiments, a linearizing circuit could be inserted between peak detector 130 and meter 134 so that meter 134 could be marked linearly.

Battery/PLL detector 136 receives an active signal from PLL/VCO chip 138 when the above-described in-phase relationship occurs. If battery/PLL detector 136 also detects via line 152 that power source 136 is charged, then battery/PLL detector 136 activates an indicator light (not shown) to indicate that meter 134 is displaying a correct reading.

In a preferred embodiment and for illustrative purposes, resistor 126 is a 330 Ω resistor. Inductor 112 is a 25 mH inductor and capacitors 114 and 120 are 500 to 1500 pf capacitors. For the component values of the described embodiment, device 100 will operate correctly when the depth of the buried layer is between 0.001 and 0.005 inches. In other embodiments, the allowable depth can be varied by using larger electrodes 118 and 124, and a larger inductor to shift the resonant frequency. Similarly, the resistivity of resistor 112 can be altered for measuring materials of different resistances. In an alternate embodiment of the present invention, the function of PLL/VCO chip 138, signal conditioning buffer 132, and signal conditioning buffer 142 could be performed by a fixed frequency oscillator and a variable inductor adjustable by a manually operated slide. In another alternate embodiment, the function of PLL/VCO chip 138, signal conditioning buffer 132, and signal conditioning buffer 142 could be achieved with a fixed frequency oscillator and a variable capacitor.

Figure 2:
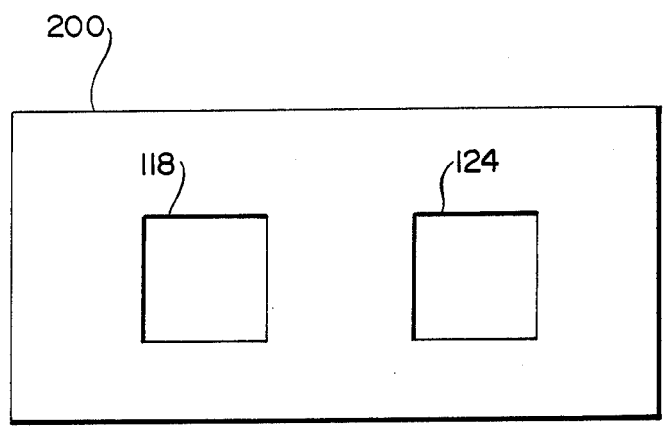
FIG. 2 is a plane view of a bottom side of a preferred embodiment of the present invention showing capacitor plates.

FIG. 2 shows a plane view of a bottom side 200 of a resistance measuring device according to a preferred embodiment of the present invention. Bottom side 200 shows driven electrode 118 and pickup electrode 124. In a preferred embodiment, both electrodes are composed of copper and are covered with a transparent polyester or MYLAR cover (MYLAR is a registered trademark of Dupont de Nemours and Company, Wilmington, Del.). However, this is not necessary within the scope of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An apparatus for non-invasively, non-destructively measuring a resistivity of a buried conductive layer surrounded by an outer layer, said apparatus comprising:
   a series resonant circuit including:
      a first capacitor including a driven electrode and operative when positioned adjacent the buried layer,
      a second capacitor including a pickup electrode and operative when positioned adjacent the buried layer,
      inductor means connected to said first capacitor;
   frequency adjustment means, connected to said first and second capacitors and to said inductor means, for automatically generating a signal having a series resonant frequency causing said circuit to resonate, said circuit having said series resonant frequency generated using a feedback signal and nullifying the effect of capacitive reactance of the first and second capacitors;
   measuring means for measuring a voltage output from said circuit; and
   means for determining the resistivity of the buried layer when said circuit is resonating, responsive to the measured voltage of said measuring means.

2. The apparatus of claim 1, wherein said measuring means further includes means for displaying said determined resistivity.

3. The apparatus of claim 1, wherein said frequency adjusting means includes a phase locked loop.

4. The apparatus of claim 1, wherein said pickup electrode includes a first capacitor plate and said buried layer includes an integral second capacitor plate.

5. The apparatus of claim 1, wherein said driven electrode includes a first capacitor plate and wherein said buried layer includes an integral second capacitor plate.

6. A method for non-invasively, non-destructively measuring a resistivity of a buried conductive layer, said method comprising the steps of:
   contacting the surface of the surrounding layer with a capacitive pickup electrode;
   contacting the surface of the surrounding layer with a capacitive driven electrode;
   connecting an inductor in series with said driven electrode and said pickup electrode;
   automatically outputting a signal current to resonate said driven electrode, said pickup electrode, and said inductor at a series resonant frequency using a feedback signal and nullifying the effect of capacitive reactance of the driven and pickup electrodes;
   measuring a voltage output from said pickup electrode; and
   determining the resistivity of the buried layer responsive to the measured voltage and said signal current.

7. The method of claim 6, wherein said measuring step further includes the step of displaying said determined resistivity.

8. The method of claim 6, wherein said signal outputting step includes the step of outputting a voltage using a phase locked loop.

9. The method of claim 6, wherein said signal outputting step includes the steps of:
   inputting frequency adjustment data; and
   outputting said resonant frequency according to said input frequency adjustment data.

10. The method of claim 6, wherein said pickup electrode includes a first capacitor plate, wherein the buried layer includes an integral second capacitor plate, and wherein said contacting step includes the step of capacitively coupling said pickup electrode and the buried layer.

11. The method of claim 6, wherein said driven electrode includes a first capacitor plate, wherein the buried layer includes an integral second capacitor plate, and wherein said contacting step includes the step of capacitively coupling said driven electrode and the buried layer.

* * * * *